United States Patent
Kura et al.

(10) Patent No.: US 7,414,952 B2
(45) Date of Patent: Aug. 19, 2008

(54) LASER DRIVING APPARATUS AND ASSOCIATED METHODOLOGY OF CONTROLLING A DRIVE CURRENT

(75) Inventors: Jumpei Kura, Kanagawa (JP); Motoi Kimura, Kanagawa (JP)

(73) Assignee: Sony Corporation, Tokyo (JP)

(*) Notice: Subject to any disclaimer, the term of this patent is extended or adjusted under 35 U.S.C. 154(b) by 700 days.

(21) Appl. No.: 10/780,511

(22) Filed: Feb. 17, 2004

(65) Prior Publication Data

US 2004/0223438 A1    Nov. 11, 2004

(30) Foreign Application Priority Data

Feb. 19, 2003    (JP)    ............................. 2003-040714

(51) Int. Cl.
*G11B 7/125*    (2006.01)
(52) U.S. Cl. .................................... 369/116; 369/53.26
(58) Field of Classification Search ................ 369/47.5, 369/47.55, 53.26, 116
See application file for complete search history.

(56) References Cited

U.S. PATENT DOCUMENTS

| | | | | |
|---|---|---|---|---|
| 5,018,155 A | * | 5/1991 | Miyairi | ........................ 372/31 |
| 5,625,616 A | * | 4/1997 | Koike et al. | ............... 369/53.26 |
| 6,731,584 B1 | * | 5/2004 | Nagara | ........................ 369/116 |
| 2003/0117923 A1 | * | 6/2003 | Asada et al. | ............. 369/59.11 |

FOREIGN PATENT DOCUMENTS

| | | |
|---|---|---|
| JP | 02-297731 | 12/1990 |
| JP | 05-299738 | 11/1993 |
| JP | 06-274921 | 9/1994 |
| JP | 07-235072 | 9/1995 |
| JP | 2000-057590 | 2/2000 |

* cited by examiner

*Primary Examiner*—Joseph Feild
*Assistant Examiner*—Nathan Danielsen
(74) *Attorney, Agent, or Firm*—Oblon, Spivak, McClelland, Maier & Neustadt, P.C.

(57) ABSTRACT

A laser driving apparatus for a light source of an optical head apparatus includes a laser, a laser driving circuit, and a radio frequency current generation circuit for generating a radio frequency current to be superimposed on the drive current. The laser driving apparatus further includes a current monitor circuit, an optical detector for detecting an optical output of the laser; a selection circuit for selecting either of non-superimposing or superimposing the radio frequency current on the drive current, an APC circuit for controlling the optical output of the laser at a constant level, and a control circuit. The control circuit controls the amplitude of the radio frequency current on the basis of current values of the drive current on non-superimposing and superimposing or detection values of the optical output of the laser on non-superimposing and superimposing.

21 Claims, 13 Drawing Sheets

LASER DRIVING APPARATUS AND ASSOCIATED METHODOLOGY OF CONTROLLING A DRIVE CURRENT

CROSS REFERENCE TO RELATED APPLICATION

This application claims priority from Japanese Priority Document No. 2003-040714, filed on Feb. 19, 2003 with the Japanese Patent Office, which document is hereby incorporated by reference.

BACKGROUND OF THE INVENTION

1. Field of the Invention

This invention relates to a laser driving apparatus for reading information from a recording medium, and to an optical head apparatus and information processing apparatus using the laser driving apparatus, wherein noise is suppressed by superimposing a radio frequency current on a laser driving current.

2. Description of the Related Art

For optically-readable disk-like recording mediums, optical head apparatuses (so-called optical pickup) including a laser light source are used to read an information signal from, for example, a recordable medium. The laser is driven by a laser driving circuit.

The laser driving circuit employs a photodetector such as a photodiode for receiving a part of laser light and an APC (Automatic Power Control) circuit for controlling a driving current of the laser on the basis of an output signal of the photodetector to control the emitted laser power at a constant level. Further, to suppress noise generated by the laser due to return of the reflection laser light from a disk-like recoding medium (so-called scoop noise), a method of superimposing a radio frequency current on the driving current of the laser is known. For example, Japanese Laid-Open patent application publication No. 2002-335041 discloses this method.

However, in the conventional apparatuses, because the amplitude value of the radio frequency current is fixed, for example, there is a problem in influence on the laser due to change in the temperature characteristic change with time, and influence on a recorded information signal, as follows:

Amplitude of the radio frequency current must be rather large in view of the scoop noise suppressing effect. However, if the amplitude is excessively large, the recorded information signal may be erased. Thus, the amplitude must be set carefully.

FIGS. 13A and 13B are graphical drawings illustrating changes in an optical output of a laser and a drive current with time. In FIG. 13A, the axis of abscissa represents elapsed time, and the axis of ordinate represents an optical output to exemplarily illustrate the change in the optical output with time. In FIG. 13B, the axis of abscissa represents elapsed time, and the axis of ordinate represents a drive current to exemplarily illustrate the change in the drive current with time.

In FIG. 13B, a reference code $I_{sh}$ represents a threshold current, and $I_{av}$ represents an average current. Emission starts when the drive current exceeds $I_{sh}$ and then, the optical output shows a peak with a delay after the start of emission. That is, the laser output shows a waveform in which a steep pulse emission component is superimposed on a dc (direct current) emission component.

In such laser emission waveform, though the drive current waveform is the same, it is known that the laser emission waveform (for example, a height of a pulse peak) changes in accordance with various laser characteristics such as a relaxation vibration frequency, a differential efficiency, a differential resistance, and the like. Thus, the laser characteristics are also influenced by dispersion among laser devices, temperature characteristics, and change with time. As a result, the amplitude value of the radio frequency current is also influenced from these factors.

SUMMARY OF THE INVENTION

Thus, it is desired to provide a method of controlling amplitude of the radio frequency current to be superimposed in accordance with dispersion in laser characteristics and change in the characteristic with temperature and passage of time. Further, it is desired to eliminate possibility that the changes in their characteristics becomes larger or as a worst case, the recorded information signal is erroneously erased during playback of a recordable optical disk, due to fixed amplitude of the superimposing radio frequency current.

According to one aspect of the present invention, stability and reliability in laser driving are improved by suitably controlling an amplitude value of the radio frequency current superimposed on a laser driving current to suppress scoop noise induced by returned laser light from a recording medium.

According to the present invention, another aspect of the present invention provides a structure which includes: current monitoring means for monitoring the drive current; optical detection means for detecting an optical output of the laser; amplitude control means for controlling an amplitude of the radio frequency current to be superimposed on the drive current; optical output control means for controlling the laser driving circuit to control the optical output of the laser at a constant level; and control means for further controlling the amplitude of the radio frequency current on the basis of current values of the drive current obtained by the current monitoring means at a plurality of the amplitudes of the radio frequency current obtained by the amplitude control means or detection values of the optical output of the laser obtained by the optical detection means at a plurality of the amplitudes of the radio frequency current obtained by the amplitude control means.

Thus, according to further another aspect of the present invention, the amplitude of the radio frequency current can be determined on the basis of monitoring results of the laser drive current and the optical output obtained at a plurality of amplitudes of the radio frequency current provided by the amplitude control means through I/L characteristic (characteristic of an optical output to a drive current) of the laser.

In addition, according to still further aspect of the present invention, various errors are prevented such as unstableness or erroneous erase which would be caused by fixed amplitude of the radio frequency current to be superimposed on the drive current because the amplitude of the radio frequency current can be determined on the basis of detection results of the laser drive current and the optical output using the laser characteristic.

Further, according to still further aspect of the present invention, the amplitude of the radio frequency current is preferably controlled by monitoring the laser drive current and the laser optical output when the radio frequency current is superimposed on the drive current and when it is not superimposed.

Further, according to still further aspect of the present invention, the amplitude of the radio frequency current is preferably controlled on the basis of difference in drive current values between when the radio frequency current is superimposed on the drive current and when it is not superimposed.

Further, according to still further aspect of the present invention, the amplitude of the radio frequency current is preferably controlled on the basis of difference in optical output values between when the radio frequency current is superimposed on the drive current and when it is not superimposed.

Further, according to still further aspect of the present invention, the amplitude of the radio frequency current is preferably provided by monitoring a temperature change for amplitude adjustment of the radio frequency current adapted to laser temperature characteristic change.

Further, according to still further aspect of the present invention, errors (erroneous erasing) due to excess optical output of the laser can be prevented.

Further, according to still further aspect of the present invention, in the application to an information processing apparatus employing an optical recording medium, a reproduction characteristic of an information signal and reliability can be improved.

BRIEF DESCRIPTION OF THE DRAWINGS

The object and features of the present invention will become more readily apparent from the following detailed description taken in conjunction with the accompanying drawings, and the same or corresponding elements or parts are designated with like references throughout the drawings in which.

DETAILED DESCRIPTION OF THE PREFERRED EMBODIMENT

The present invention relates to a laser driving apparatus for a semiconductor laser or the like and an optical head apparatus and an information processing apparatus using the laser driving apparatus. For example, this invention is applicable to various apparatuses for recording and reproduction of a video signal or an audio signal and for data recording and reproduction in a computer or the like.

Figure 1:
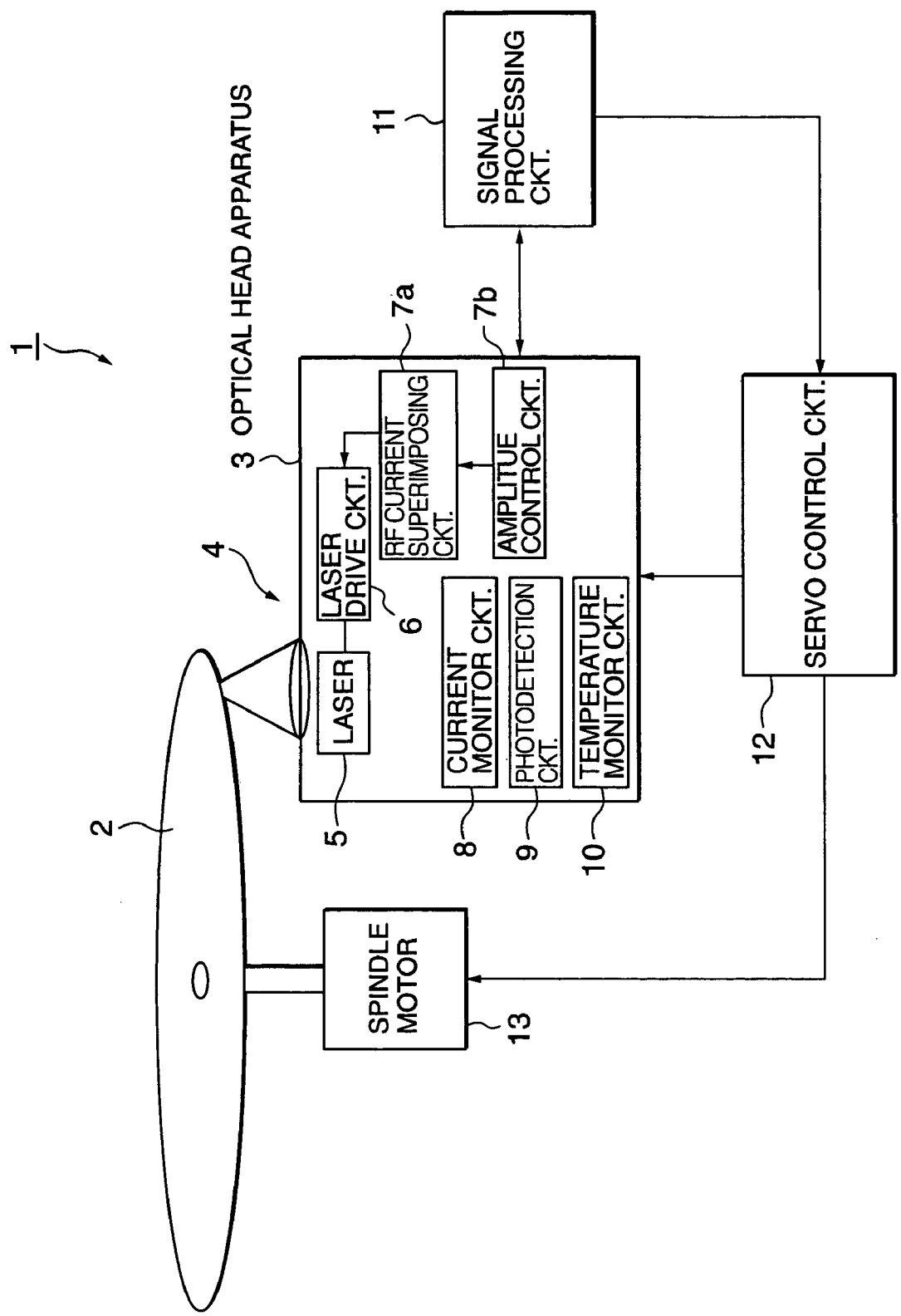
FIG. 1 is a block diagram illustrating of a basic structure of an information processing apparatus according to the present invention.

FIG. 1 is a block diagram illustrating a basic structure of an information processing apparatus according to the present invention. This information processing apparatus 1 comprises an optical head apparatus 3 for reading and recording an information signal of a recording medium 2. The recording medium 2 comprises a disk-like recording medium such as a magneto-optical disk or a phase-change optical disk.

The optical head apparatus 3 includes a light source section 4 for reading the information signal from the recording medium 2 in which a laser light source such as a laser diode is employed. More specifically, the light source section 4 includes a laser 5 and a laser drive circuit 6 for supplying a drive current to the laser 5.

To suppress scoop noise during reproducing a recorded signal on an optical disk using a semiconductor laser as a light source, the earlier mentioned method of generating and superimposing a radio frequency current on the laser drive current is adopted. Thus, a radio frequency current superimposing circuit 7a is provided to the light source section 4. The radio frequency current superimposing circuit 7a operates under control of an amplitude control circuit 7b to control an amplitude (including an amplitude of zero) of the radio frequency current to be superimposed on the drive current of the laser 5. The optical head apparatus 3 further comprises a current monitor circuit 8 for monitoring the drive current of the laser 5, a photodetection circuit 9 for detecting an optical output of the laser 5 to monitor it, and a temperature monitor circuit 10 for monitoring a temperature of the laser 5. They are described in detail later.

The information signal read out from the recording medium 2 by the optical head apparatus 3 is supplied to a signal processing circuit 11 including a demodulation circuit or the like to be subjected to necessary processes for reproduction. Upon recording information, a signal modulated in the signal processing circuit 11 is supplied to the optical head apparatus 3, which records the signal on the recording medium 2 (irrespectively of the method of recording).

A servo control circuit 12 controls the operation of a driving mechanism in the optical head apparatus 3 and the drive of the recording medium 2. For example, the servo control circuit 12 performs a focus servo control or a tracking servo control by controlling currents flowing through coils in an actuator (so-called two-axis actuator) for driving a lens system (object lens or the like) in the light source section 4 in which servo error signals necessary for control are supplied from the signal processing circuit 11 to the servo control circuit 12. Further, if a disk-like recording medium is used, the servo control circuit 12 controls a rotation of a spindle motor 13. In addition, the servo control circuit 12 controls mechanisms necessary for reading and recording the information signal for the recording medium 2. For example, the servo control circuit 12 controls a mechanism for carrying the optical head apparatus 3 to determine a field position of the optical head apparatus 3 with respect to the recording medium 2 along with a predetermined direction (so-called thread control).

Next, control for an amplitude value of the radio frequency current to be superimposed on the drive current of the laser 5 will be described. According the present invention, the amplitude of the radio frequency current to be superimposed on the drive current is controlled on the basis of the current values of the laser drive current or values of an optical output of the laser obtained at a plurality of amplitudes of the radio frequency current provided by control of the amplitude control circuit 7b. For example, to determine a target amplitude of the radio frequency current, differences in the drive current relative to plural different amplitude values of the radio frequency current is monitored as follows:

First, assuming that amplitude setting values of the radio frequency current during superimposing are m1 and m2 (where m2=m1×2), the difference in the drive current between m1 and m2 is controlled at a constant level. In this case, because superimposing is not switched off or the amplitude is not made zero, the servo control is relatively stable. Second, it is assumed that the amplitude setting values of the radio frequency current during superimposing are, for example, three different values, m1, m2, and m3 and drive current values for respective setting values are I1, I2, and I3. Then, the drive current upon non-superimposition of the radio frequency current (amplitude is zero) is presumed from plotted three points I1, I2, and I3.

Figure 2:
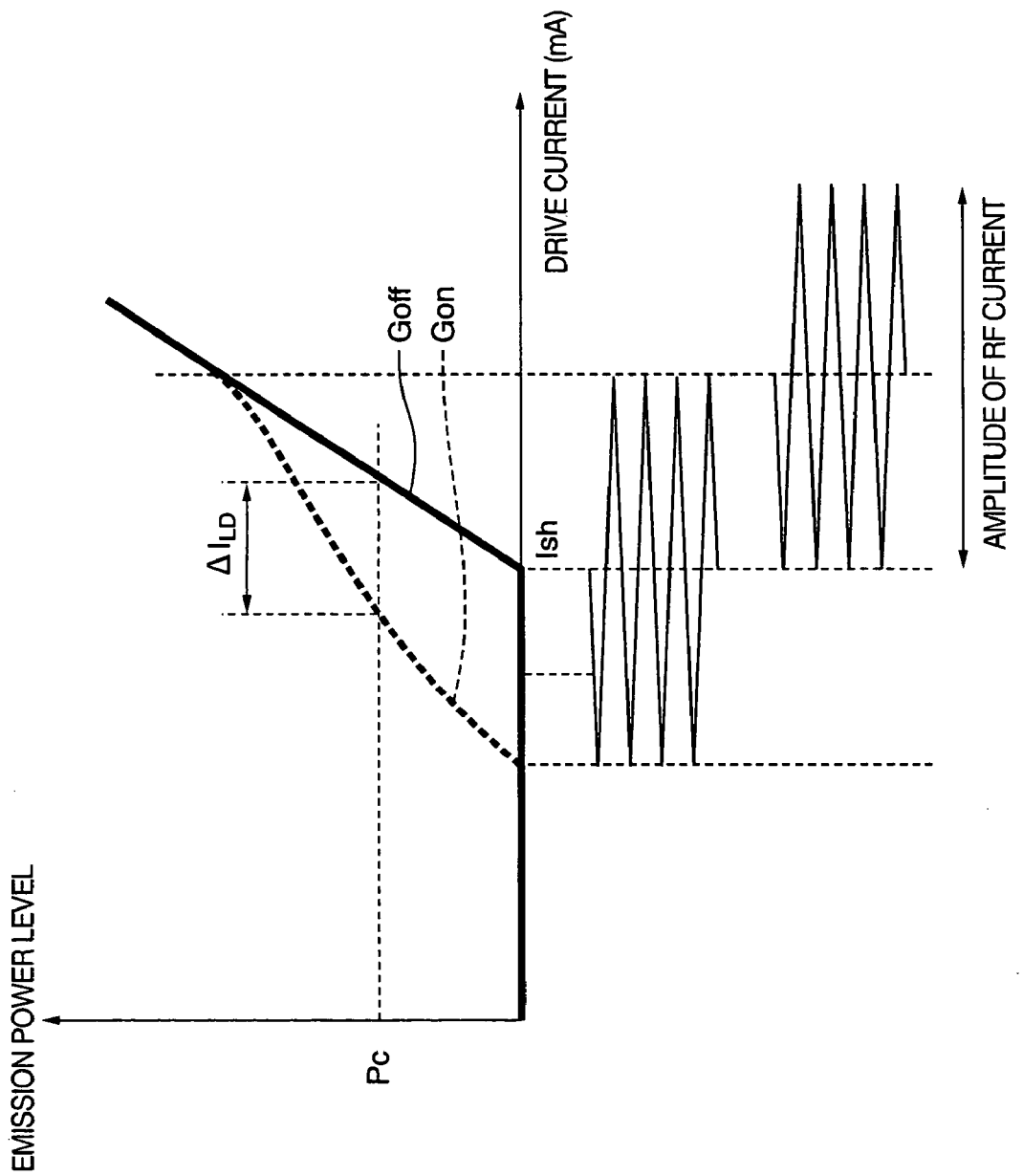
FIG. 2 is a graphical drawing illustrating a first method of controlling amplitude of radio frequency current to be superimposed on a laser drive current.

Further, two amplitude values of the radio frequency current, namely, zero and non-zero are defined to determine a target amplitude of the radio frequency current, and thus there are two methods of determining the target value of the amplitude of the radio frequency current as follows:

(I) The target value of the amplitude of the radio frequency current is determined on the basis of a difference between the drive current monitored when the radio frequency current is superimposed on the driving current and the driving current monitored when the radio frequency current is not superimposed on the driving current, under condition that the optical output of the laser is controlled at the constant level (refer to FIG. 2).

Figure 3:
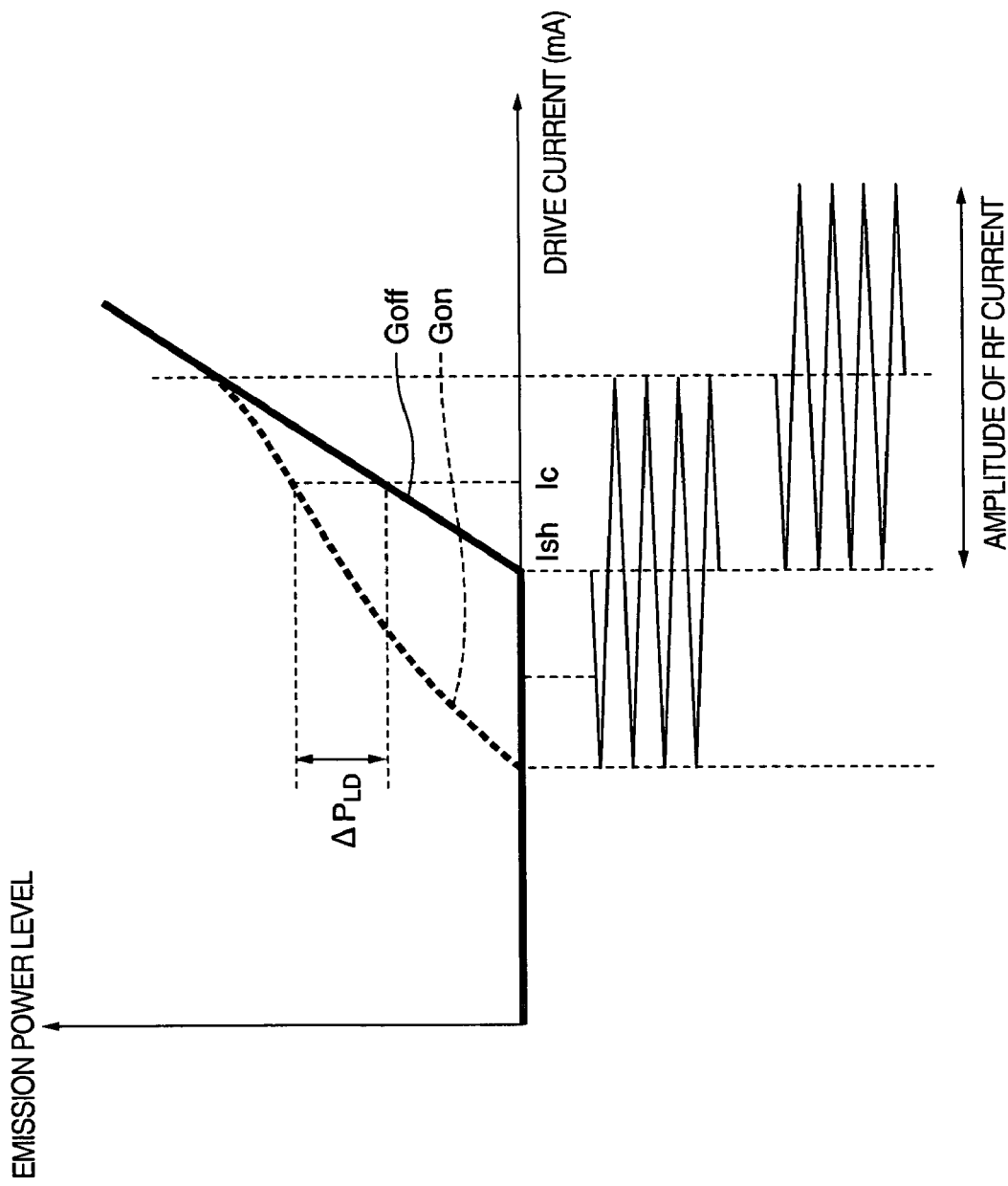
FIG. 3 is graphical drawing illustrating a second method of controlling the amplitude of radio frequency current.

(II) The target value of the amplitude of the radio frequency current is determined on the basis of a difference between the optical output detected when the radio frequency current is superimposed on the driving current and the optical output detected when the radio frequency current is not superimposed on the driving current, under condition that the drive current is controlled at the constant level (refer to FIG. 3).

These methods are described with reference to FIGS. 2 and 3, in which the axes of abscissa represent the laser drive current, and the axes of ordinate represent an emission power of the laser. Further, the solid curves Goff represent a characteristic when the radio frequency current is not superimposed. On the other hand, the chain line curves Gon represent a characteristic when the radio frequency current is superimposed.

First, the first method (I) will be described. In FIG. 2, if the radio frequency current is not superimposed, as shown by the curve Goff, the emission power starts to increase when the drive current exceeds threshold value Ish. On the other hand, if the radio frequency current is superimposed, as shown by the curve Gon, the emission power can be also obtained below the threshold value Ish. This is because the drive current exceeds the threshed value Ish at a peak of the radio frequency current.

In the drawing, a reference code Pc represents a constant emission power level of the laser and $\Delta I_{LD}$ represents a difference in the drive current necessary for emitting the laser light at the power level Pc between non-superimposing and superimposing of the radio frequency current. In other words, if the laser is driven to emit the laser light at the same power level Pc, the drive current on non-superimposing must be larger than that of on superimposing, and $\Delta I_{LD}$ represents a difference in the drive current therebetween.

In the first method (I), the target amplitude of the radio frequency current is determined in accordance with the difference of the laser drive current values between non-superimposing and superimposing. For example, an upper limit of the amplitude is determined on the basis of the $\Delta I_{LD}$ to prevent the amplitude from being excessively large, or the amplitude value is controlled to have a constant value of the $\Delta I_{LD}$.

Second, the second method (II) will be described. In FIG. 3, the curve Goff on non-superimposing and the curve Gon on superimposing are the same as those in FIG. 2. On the other hand, in the drawing a code Ic represents a constant drive current value for the laser, and a $\Delta P_{LD}$ represents a difference in the laser light emission power between non-superimposing and superimposing when the laser 5 is driven at the drive current Ic. Assuming that the laser is driven to emit the laser light at the same drive current Ic, the emission power on superimposing the radio frequency current is clearly larger than that of on non-superimposing, and thus, the $\Delta P_{LD}$ represents the difference in the power level therebetween.

In the second method (II), the target amplitude of the radio frequency current is determined in accordance with the difference of the laser emission power values between non-superimposing and superimposing. For example, an upper limit of the amplitude is determined on the basis of the $\Delta P_{LD}$ to prevent the amplitude from being excessively large, or the amplitude value is controlled to have a constant value of the $\Delta P_{LD}$.

Figure 4:
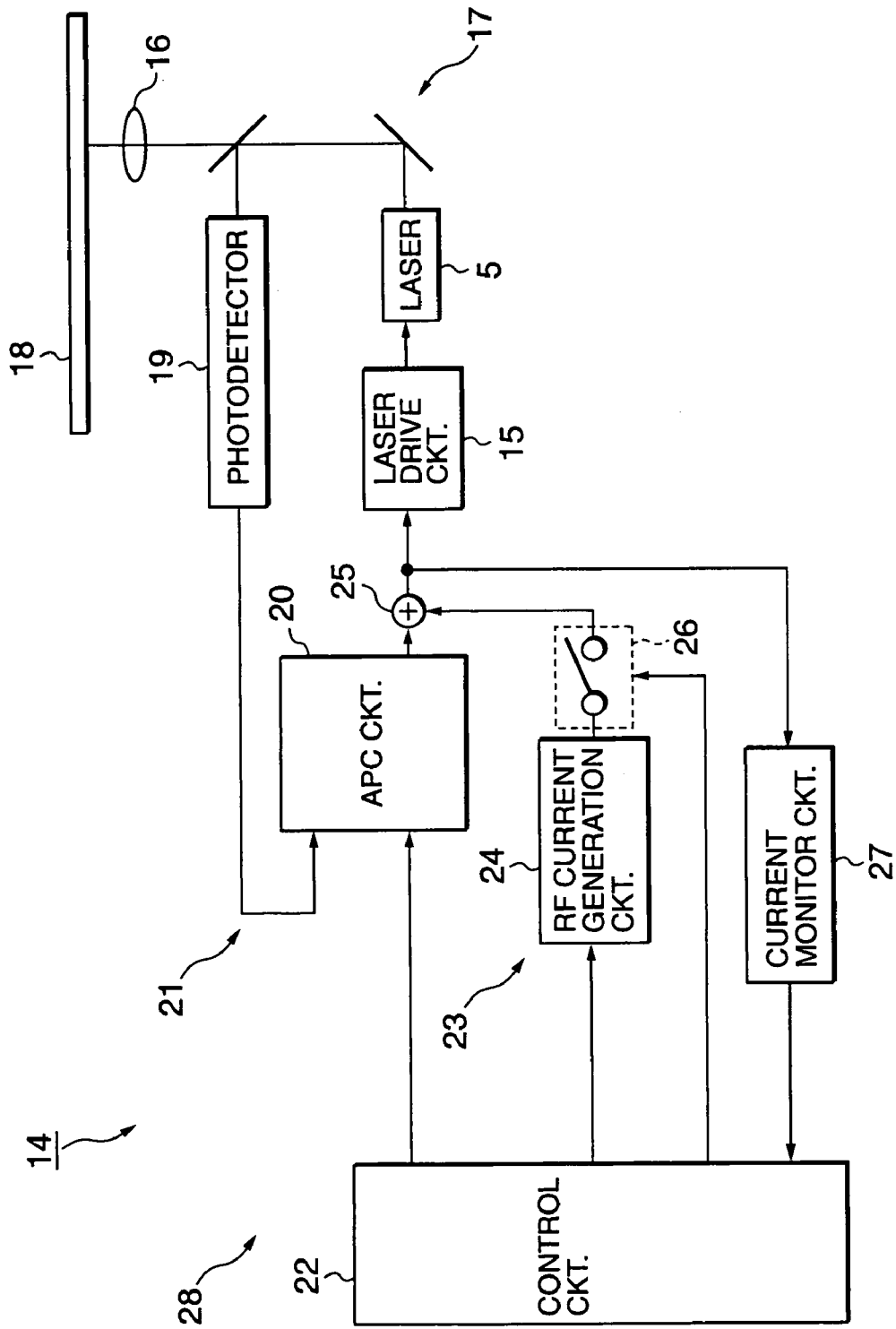
FIG. 4 is a block diagram illustrating a structure of a laser drive apparatus according to the present invention.

Next, one exemplified structure employing the first method (I) will be described with reference to FIGS. 4 to 6. FIG. 4 is a block diagram illustrating a structure of a laser drive apparatus, which is applied to an optical disk apparatus.

The laser drive apparatus 14 comprises a drive circuit 15 for supplying a drive current to the laser 5, which emits laser light irradiated to an optical disk 18 through an optical system 17 including an object lens 16.

A portion of the laser light from the laser is received by a photodetector 19, which converts the received laser light into a current, which is supplied to an APC circuit 20 as a laser output monitor signal. The photodetector 19 corresponds to the photodetection circuit 9 in FIG. 1.

The APC circuit 20 controls the drive circuit 15 to control the optical output of the laser 5 at a constant level and forms an optical output control section 21. The APC circuit 20 supplies a current output to the drive circuit 15 to have a desired light intensity of the emitted laser light from the laser 5 on the basis of a laser output monitor signal applied thereto and a control command value (APC control command value) from a control circuit 22.

A radio frequency current superimposing circuit 23 for generating a radio frequency current and superimposing the radio frequency current on the laser drive current, comprises a radio frequency generation circuit 24 and an adder 25 in this embodiment, and further comprises a selection circuit 26 (shown with a symbol of a switch in the drawing) provided between the radio frequency generation circuit 24 and the adder 25 for selecting either non-superimposing or superimposing the radio frequency current on the drive current.

The radio frequency current generation circuit 24 comprises a voltage-controlled oscillator (VCO) or the like which generates, in response to a control command value (radio frequency current amplitude command value), the radio frequency current with an amplitude corresponding an command value from the control circuit 22 and supplies the radio frequency current to the adder 25 through the selection circuit 26. The selection circuit 26 comprises, for example, a radio frequency switch circuit, which makes the circuit close and open (ON/OFF) in response to an open/close command from the control circuit 22.

The adder 25 is arranged at a rear stage of the APC circuit 20 and supplies a current obtained by adding the radio frequency current from the radio frequency current generation circuit 24 to the output current of the APC circuit 20 when the selection circuit 26 is made close. When the selection circuit is made open, the adder 25 supplies the output signal from the APC circuit 20 to the drive circuit 15 as it is.

A current monitor circuit 27 corresponds to the earlier mentioned current monitor circuit 8 in FIG. 1 and monitors the output current of the adder 25 (i.e., this corresponds to the laser drive current) and supplies a current monitor value to a control circuit 22.

The control circuit 22 including a CPU (central processing unit) supplies control command values to the APC circuit 20 and the radio frequency generation circuit 24 and controls the open/close condition of the selection circuit 26 by sending an command. That is, the control circuit 22 forms the above-described amplitude control circuit 7b with the selection circuit 26 and forms a control section 28 for controlling the amplitude of the radio frequency current on the basis of the current values of the laser drive current (current monitor value) when the radio frequency is superimposed by the selection circuit 26 in an ON condition and when the radio frequency is not superimposed by the selection circuit 26 in OFF condition. Here, the amplitude control of the radio frequency current is performed temporarily, for example, at adjustment in initial setting at startup of the apparatus. However, it is preferable that the amplitude control is performed not temporarily, but periodically or regularly in accordance with the condition in view of the fact that the temperature characteristic and the change with time of the laser are considerably large in controlling as mentioned earlier.

In this embodiment, the selection circuit 26 is provided at the output stage of the radio frequency generation circuit 24. However, this does not mean that the selection circuit 26 is essential. That is, the function of the selection circuit 26 is provided by making zero the radio frequency current amplitude command value supplied from the control circuit 22 to the radio frequency generation circuit 24. Thus, the selection circuit 26 can be provided with a hardware structure for physical operation or a software structure by making the amplitude setting value zero.

Figure 5:
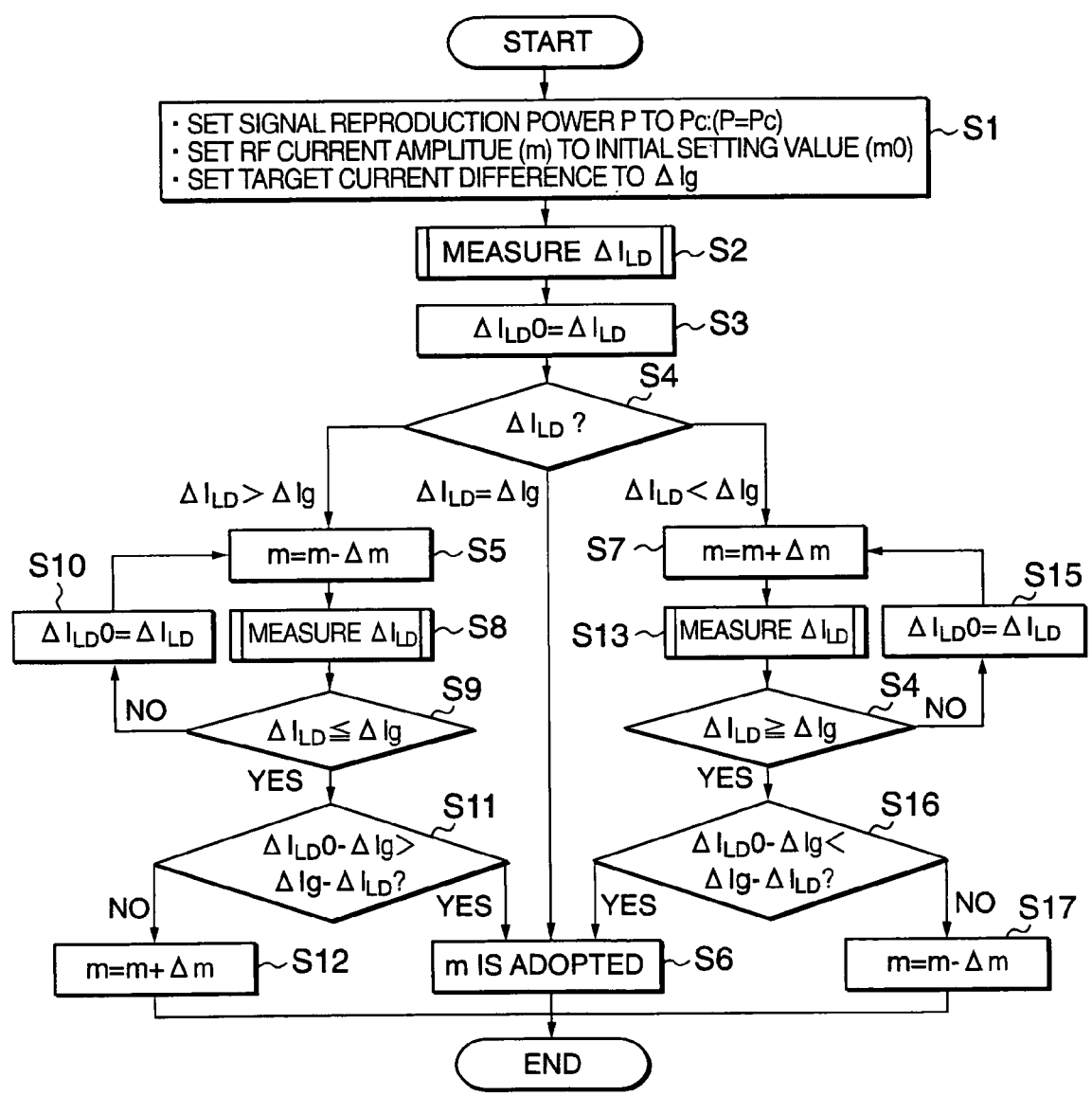
FIG. 5 depicts a flow chart illustrating a general flow for describing a setting process of the radio frequency current amplitude value together with FIG. 6.
Figure 6:
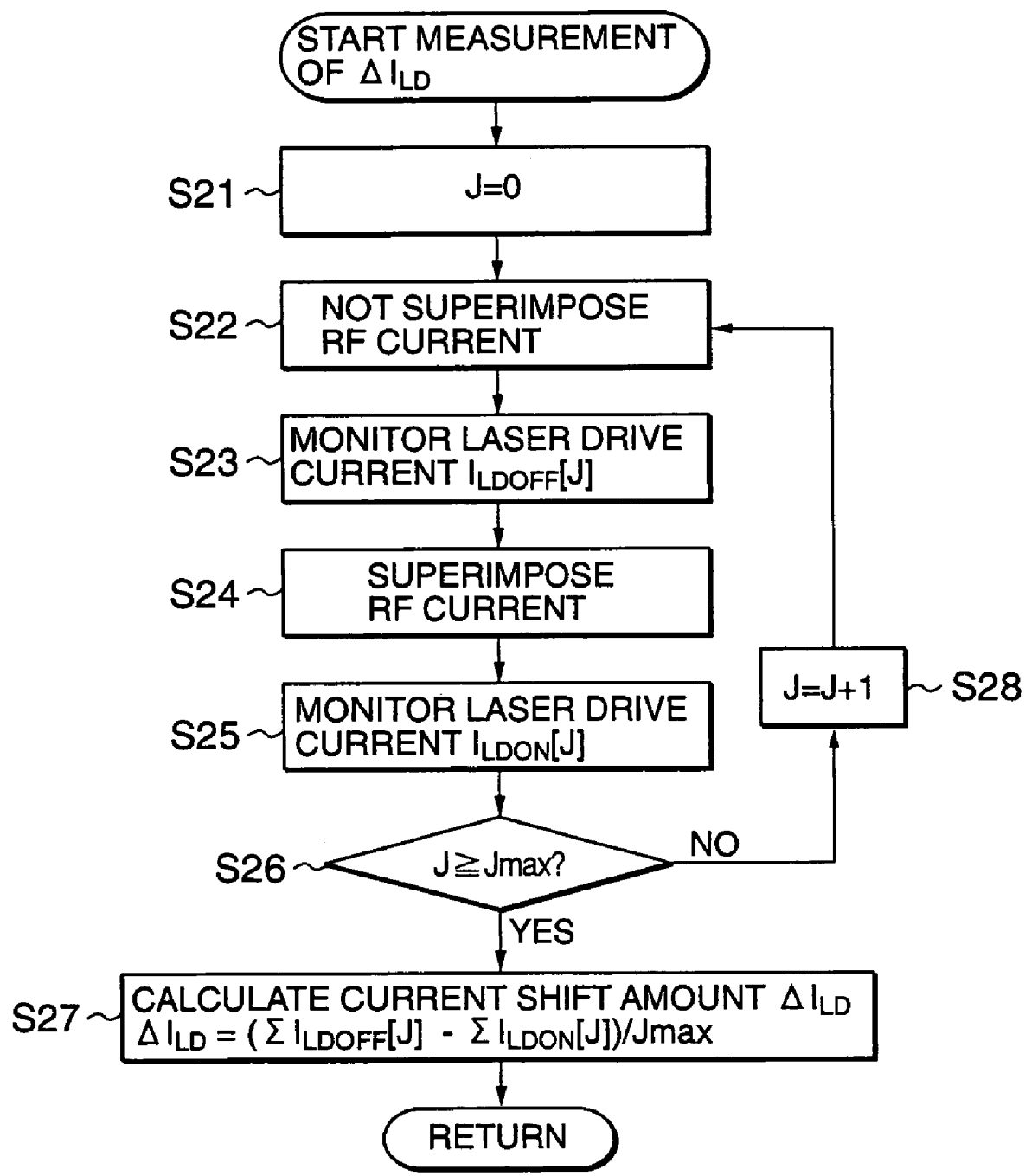
FIG. 6 depicts a flow chart for describing an example of measuring process of a laser drive current difference ($\Delta I_{LD}$)

FIGS. 5 and 6 depict flow charts illustrating setting process of the radio frequency current amplitude value according to the first method (I). FIG. 5 illustrates the general flow and FIG. 6 illustrates the measurement process of the difference ($\Delta I_{LD}$) in the drive current.

First, in step S1 in FIG. 5, an emission power P of the laser 5 is set to a constant value Pc (P=Pc, refer to FIG. 2). That is, the control circuit 22 sends a control command value corresponding to the constant value Pc to the APC circuit 20. Here, it is preferable that the constant value Pc is not greater than a power value necessary for signal reproduction.

An amplitude m of the radio frequency current is set to an initial value m0 in accordance with the control command from the control circuit 22 to the radio frequency current generation circuit 24 and as well as in the control circuit 22, a target current difference in the laser drive current is set to $\Delta Ig$ (target value of difference $\Delta I_{LD}$ in the drive current).

In the next step S2, the difference in the drive current $\Delta I_{LD}$ is measured (this process is shown in FIG. 6 and will be in detail later). In step S3, the value of $\Delta I_{LD}$ measured in the previous step S2 is stored in the variable $\Delta I_{LD}0$. This variable is provided to hold the once-previous value of $\Delta I_{LD}$.

In the following step S4, the value $\Delta I_{LD}$ is judged on the basis of three judgment conditions. That is, the processing proceeds to step S5 when $\Delta I_{LD}$ is higher than the target difference in current $\Delta Ig$ ($\Delta I_{LD} > \Delta Ig$), the processing proceeds to step S6, when $\Delta I_{LD}$ is equal to $\Delta Ig$ ($\Delta I_{LD} = \Delta Ig$), and the processing proceeds to step S7, when $\Delta I_{LD}$ is lower than $\Delta Ig$ ($\Delta I_{LD} < \Delta Ig$).

First, when $\Delta I_{LD} = \Delta Ig$, the target difference in the current is obtained at the first measurement, so that the processing proceeds to step S6, where the amplitude of the radio frequency current is set to the present value of m, i.e., m0.

When $\Delta I_{LD} > \Delta Ig$, a value (m−$\Delta$m) obtained by subtracting a predetermined difference (referred to as $\Delta$m) from the present value m of the amplitude of the current is adopted as a new m (m=m−$\Delta$m). Next, the processing proceeds to step S8, where $\Delta I_{LD}$ is measured again and the processing proceeds to step S9.

In step S9, the value of $\Delta Ig$ measured in the previous step S8 is compared with $\Delta Ig$. When $\Delta I_{LD} \leq \Delta Ig$, the processing proceeds to step S11.

When $\Delta I_{LD} > \Delta Ig$, the processing proceeds to step S10.

When the value of $\Delta I_{LD}$ exceeds the target difference in the current $\Delta Ig$, in step S10, the value $\Delta I_{LD}$ is stored in a variable $\Delta I_{LD}0$, and then the processing returns to step S5.

In step S11, judgment is made as to which one of $\Delta I_{LD}0$ and $\Delta I_{LD}$ is closer to $\Delta Ig$. That is, when $\Delta I_{LD}0 - \Delta Ig > \Delta Ig - \Delta I_{LD}$ (or $|I_{LD}0 - \Delta Ig| > |Ig - \Delta I_{LD}|$), $\Delta I_{LD}$ is closer to $\Delta Ig$, so that the processing proceeds to step S6, where the present value of m is adopted for the amplitude of the radio frequency current. When $\Delta I_{LD}0$ is closer to $\Delta Ig$, the processing proceeds to step S12, where a value (m+$\Delta$m) obtained by adding $\Delta$m to the present value of m is set to the amplitude value of the radio frequency current. This is because the value of m corresponding to $\Delta I_{LD}0$ is obtained by restoring the value before subtracting $\Delta$m.

When $\Delta I_{LD} < \Delta Ig$, the processing is executed in a reverse way to the case $\Delta I_{LD} > \Delta Ig$ (in the above description, the addition is exchanged with the subtraction and the sign of inequality is reversed). That is, in step S7, a value (m+$\Delta$m) obtained by adding a predetermined difference (referred to as $\Delta$m) to the present value m of the amplitude of the current is adopted as a new m (m=m+$\Delta$m). Next, the processing proceeds to step S13, where $\Delta I_{LD}$ is measured again and the processing proceeds to step S14. In step S14, the measured value of $\Delta I_{LD}$ is compared with $\Delta Ig$. When $\Delta I_{LD} > \Delta Ig$, the processing proceeds to step S16. When $\Delta I_{LD} < \Delta Ig$, the processing proceeds to step S15, where the value $\Delta I_{LD}$ is stored in a variable $\Delta I_{LD}0$, and then the processing returns to step S7.

In step S16, judgment is made as to which one of $\Delta I_{LD}0$ and $\Delta I_{LD}$ is closer to $\Delta Ig$. That is, when $\Delta I_{LD}0 - \Delta Ig < \Delta Ig - \Delta I_{LD}$ (or $|\Delta I_{LD}0 - \Delta Ig| > |\Delta Ig - \Delta I_{LD}|$), $\Delta I_{LD}$ is closer to $\Delta Ig$, so that the processing proceeds to step S6, where the present value of m is adopted for the amplitude of the radio frequency current. When $\Delta I_{LD}0$ is closer to $\Delta Ig$, the processing proceeds to step S17, where a value (m−$\Delta$m) obtained by subtracting $\Delta$m from the present value of m is set to the amplitude value of the radio frequency current. This is because the value of m corresponding to $\Delta I_{LD}0$ is obtained by restoring the value before adding $\Delta$m.

The value of m set in step S6, S12, and S17 is sent to the radio frequency current generation circuit 24 from the control circuit 22 as amplitude command value.

As mentioned above, according to this embodiment, under the condition that the optical output of the laser is controlled at a constant level, the control circuit 22 obtains the difference ($\Delta I_{LD}$) in the drive current between when the radio frequency current is superimposed and not superimposed and controls the amplitude of the radio wave frequency current so as to make the difference at a substantially constant level (target difference in current $\Delta Ig$).

Measurement of $\Delta I_{LD}$ will be described. In step S21 in FIG. 6, an integer variable J indicative of the number of times is introduced and is initialized (J=0). In the next step S22, the control circuit 22 sends an command to the selection circuit 26 to make the circuit open to set it not to superimpose the radio frequency.

In the following step S23, a current monitor value is obtained from the current monitor circuit 27 and is stored in array variables $I_{LDOFF}[J]$. That is, $I_{LDOFF}[J]$ represents a laser drive current on non-superimposing at the value of J.

In the following step S24, the control circuit 22 sends a command to the selection circuit 26 to make the circuit close to set it to superimpose the radio frequency. In the following step S25, a current monitor value is obtained from the current monitor circuit 27 and is stored in array variables $I_{LDON}[J]$. That is, $I_{LDON}[J]$ represents a laser drive current on superimposing at the value of J.

In step S26, the value of J is compared with the upper limit value $J_{max}$. When $J \geq J_{max}$, the processing proceeds step S27. When the number of times does not reach the predetermined times, the processing proceeds to step S28, where one is added to the value of J (incremented), and then the processing returns to step S22.

In step S27, the value of $\Delta I_{LD}$ (average value) is calculated. That is, the value of $\Delta I_{LD}$ is obtained from $\Delta I_{LD} = (\Sigma I_{LDOFF}[J] - \Sigma I_{LDON}[J])/J_{max}$. Here, $\Sigma$ represents a sum regarding variable J. If the value of $J_{max}$ is excessively large, a time interval necessary for the processing becomes long, so that it is preferable that a suitable number of times is determined in consideration of accuracy of measurement (for example, four or five times).

Since the measurement process of $\Delta I_{LD}$ is a subroutine defined in FIG. 5 (refer to steps S2, S8, and S13), the processing returns to the main routine after step S27. In this example, after the measurement of the drive current on non-superimposing, the drive current on superimposing is measured. However, the order can be reversed.

Figure 7:
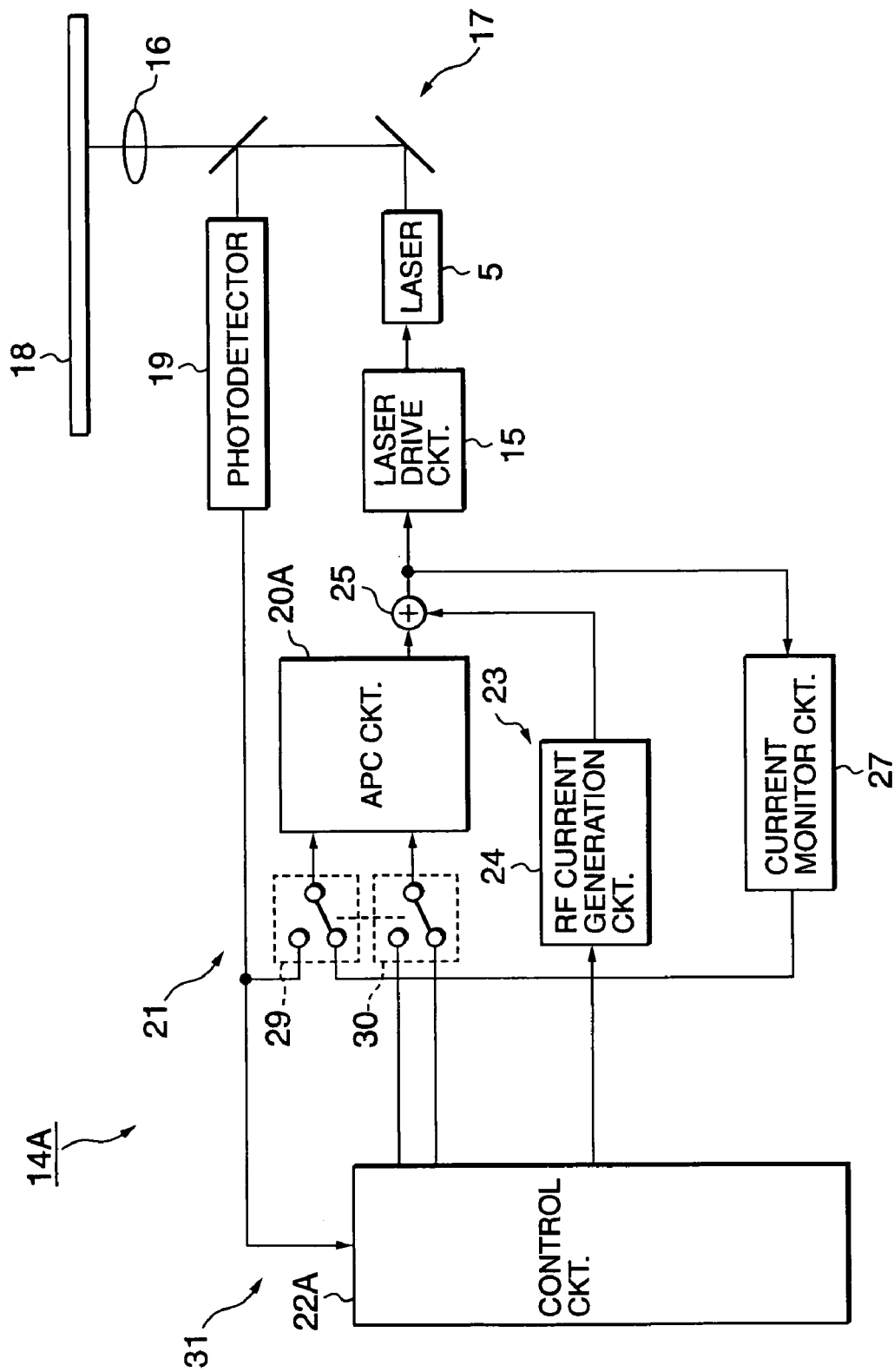
FIG. 7 is a block diagram illustrating another example of a laser drive apparatus according to the present invention.

A structure adopting the second method (II) will be described with reference to FIGS. 7 to 9. FIG. 7 is a block diagram illustrating an example of the laser drive apparatus, which is applied to an optical disc apparatus. A large part of the laser drive apparatus 14A is similar to that shown in FIG. 4. Thus, the different points will be described mainly.

The APC circuit 20A is selectively supplied with the detection result from the photodetector 19 (laser output monitor value) and monitor information from the current monitor circuit 27 (current monitor value), wherein a switch circuit 29 is further provided in the drawing for better understanding. That is, the switch circuit 29, in the first condition selecting one contact, supplies the current monitor value to the APC circuit 20A and in the second condition selecting the other contact, the switch circuit 29 supplies the laser output monitor value to the APC circuit 20A. Further, the laser output monitor value from the photodetector 19 is also supplied to the control circuit 22A.

In addition, between the APC circuit 20A and the control circuit 22A, another switch circuit 30 is provided in which in the first condition selecting one contact, the switch circuit 30 supplies a control command value regarding the laser drive current (a constant current command value) to the APC circuit 20A. In the second condition selecting the other contact, the switch circuit 30 supplies an optical output control command value (APC control command value) from the control circuit 22A to the APC circuit 20A.

The switch circuit 29 is linked to the switch circuit 30 in which in the first condition of the switch circuit 30, i.e., in the condition that the command for constant laser drive current is supplied to the APC circuit 20A, the switch circuit 29 is in the first condition in which the current monitor value is supplied to the APC circuit 20A. In the second condition of the switch circuit 30, i.e., in the condition that the command of a constant laser emission power is supplied to the APC circuit 20A, the switch circuit 29 is in the second condition in which the laser output monitor value is supplied to the APC circuit 20A.

In this example, the superimposing and non-superimposing is determined by setting the radio frequency current amplitude command value for the radio frequency current generation circuit 24 to either to non-zero or zero. In other words, the control circuit 22A partially forming the amplitude control circuit 7b mentioned earlier provides the function of the selection circuit 26 in FIG. 4. The control circuit 22A further controls the amplitude of the radio frequency current on the basis of the optical output of the laser 5 (laser output monitor values) obtained from the photodetector 19 between superimposing and non-superimposing of the radio frequency current.

Figure 8:
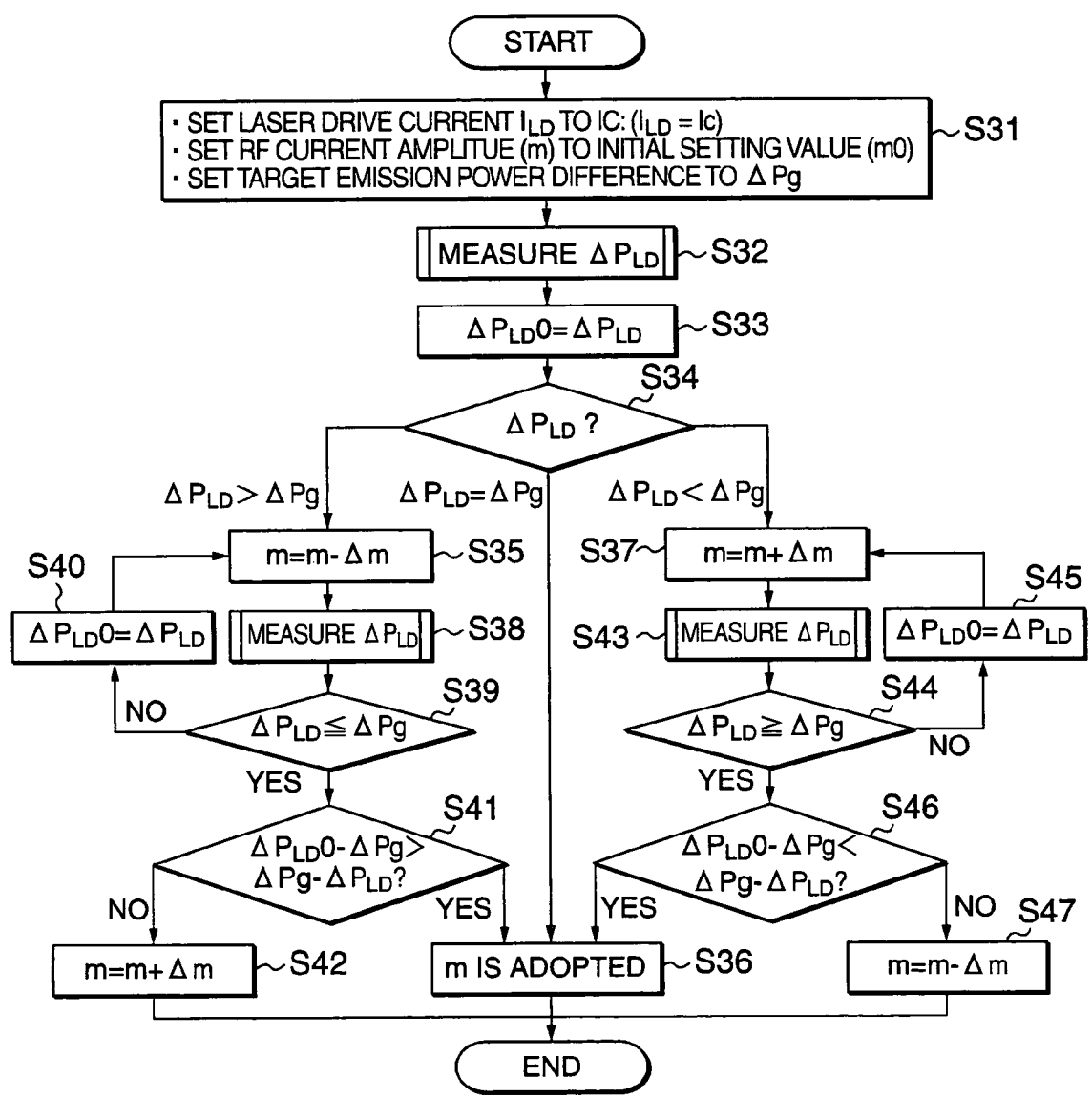
FIG. 8 depicts a flow chart illustrating a general flow for describing a setting process of the radio frequency current amplitude value together with FIG. 9.
Figure 9:
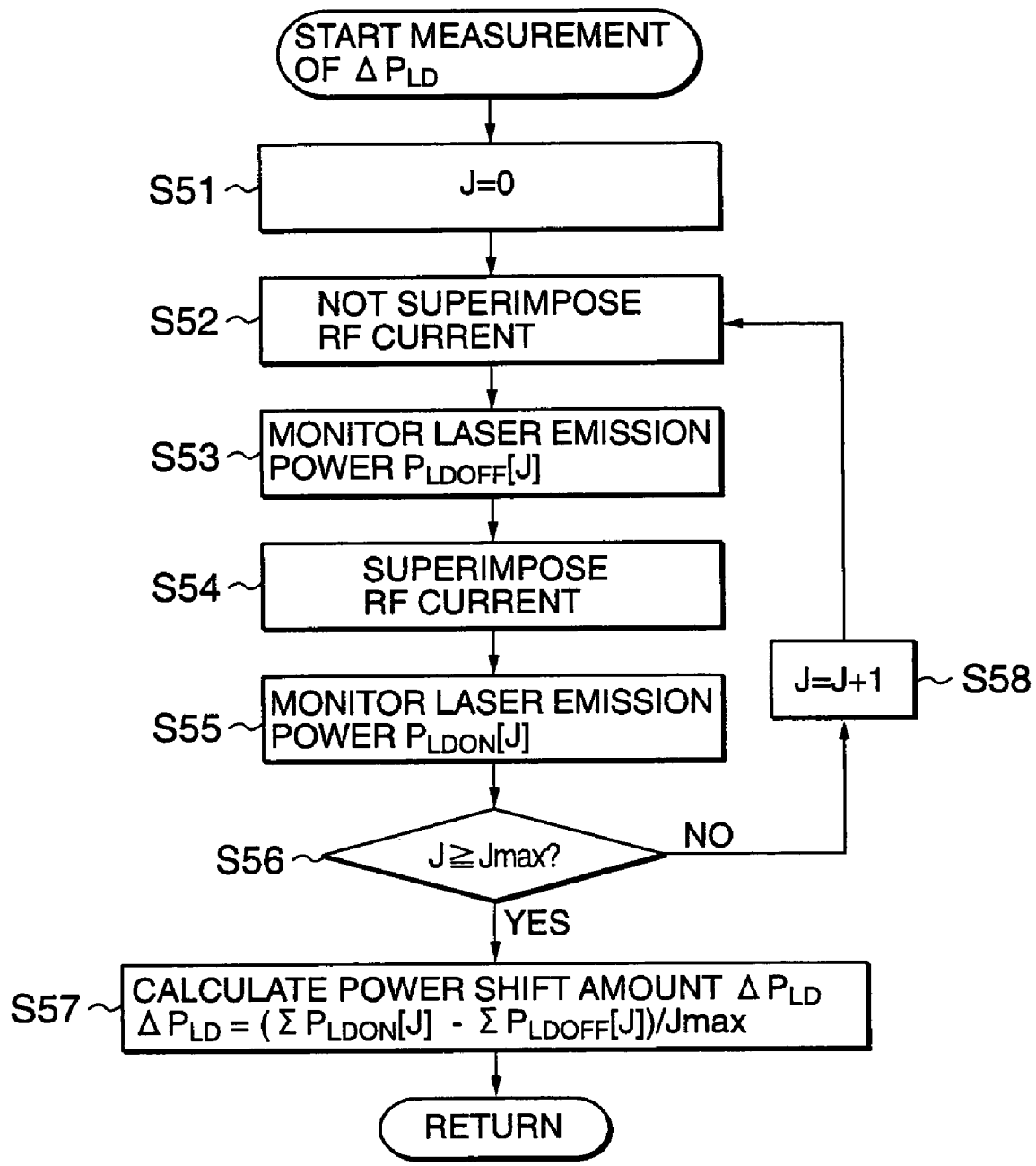
FIG. 9 depicts a flow chart for describing measuring process of a laser emission power difference ($\Delta P_{LD}$)

FIGS. 8 and 9 depict flow charts illustrating a setting process of the radio frequency current amplitude value according to the second method (II). FIG. 8 illustrates a general flow and FIG. 9 illustrates a measurement process of the difference in the drive current ($\Delta P_{LD}$).

Process shown in FIG. 8 is similar to that shown in FIG. 5. The difference between FIGS. 5 and 8 is in that the amplitude of the radio frequency current is controlled at a constant level with that difference in the laser emission power $\Delta P_{LD}$ is constant under the condition that the drive current $I_{LD}$ is constant. In other words, the process in FIG. 8 can be provided by changing the current I with the power P.

First, in step S31 in FIG. 8, the laser drive current $I_{LD}$ is set to a constant value Ic (refer to FIG. 3). That is, in FIG. 7, the switching circuits 29 and 30 are set in the first conditions, and the control circuit 22A sends a constant current command value corresponding to Ic to the APC circuit 20A, and a current monitor value is supplied to the APC circuit 20A.

An amplitude m of radio frequency current is set to an initial value m0 in accordance with the control command from the control circuit 22A to the radio frequency current generation circuit 24 and as well as in the control circuit 22A, a target emission power difference is set to $\Delta P_g$ (the target value $\Delta P_{LD}$ mentioned above).

In the next step S32, the emission power difference $\Delta P_{LD}$ is measured (this process is shown in FIG. 9 and will be in detail later). In step S33, the value of $\Delta P_{LD}$ measured in the previous step S32 is stored in the variable $\Delta P_{LD}0$. This variable is provided to hold the once-previous value of $\Delta P_{LD}$.

In the following step S34, the value $\Delta P_{LD}$ is judged on the basis of three judgment conditions. That is, the processing proceeds to step S35 when $\Delta P_{LD}$ is higher than the target emission power difference $\Delta Pg$ in current ($\Delta P_{LD} > \Delta Pg$), the processing proceeds to step S36, when $\Delta P_{LD}$ is equal to $\Delta Pg$ ($\Delta P_{LD} = \Delta Pg$), and the processing proceeds to step S37, when $\Delta P_{LD}$ is lower than $\Delta Pg$ ($\Delta P_{LD} < \Delta Pg$).

First, when $\Delta P_{LD} = \Delta Pg$, the target emission power difference has been obtained at the first measurement, so that the processing proceeds to step S36, where the amplitude of the radio frequency current is set to the present value of m, i.e., m0.

When $\Delta P_{LD} > \Delta Pg$, a value (m−Δm) obtained by subtracting a predetermined difference (referred to as Δm) from the present value m of the amplitude of the current is adopted as a new m (m=m−Δm). Next, the processing proceeds to step S38, where $\Delta I_{LD}$ is measured again and the processing proceeds to step S39. In step S39, the value of ΔPg measured in the previous step S38 is compared with ΔPg. When $\Delta P_{LD} < \Delta Pg$, the processing proceeds to step S41. When $\Delta P_{LD} > \Delta Pg$, the processing proceeds to step S40. When the value of $\Delta P_{LD}$ exceeds the target difference in current ΔPg, in step S40, the value $\Delta P_{LD}$ is stored in a variable $\Delta P_{LD}0$, and then the processing returns to step S35.

In step S41, judgment is made as to which one of $\Delta P_{LD}0$ and $\Delta P_{LD}$ is closer to ΔPg. That is, when $\Delta P_{LD}0 - \Delta Pg > \Delta Pg - \Delta P_{LD}$ (or $|\Delta P_{LD}0 - \Delta Pg| > |\Delta Pg - \Delta PLD|$, $\Delta P_{LD}$ is closer to ΔPg, so that the processing proceeds to step S36, where the present value of m is adopted for the amplitude of the radio frequency current. When $\Delta P_{LD}0$ is closer to ΔPg, the processing proceeds to step S42, where a value (m+Δm) obtained by adding Δm to the present value of m is set for the amplitude value of the radio frequency current. This is because the value of m corresponding to $\Delta P_{LD}0$ is obtained by restoring the value before subtracting Δm in step S35.

When $\Delta P_{LD} < \Delta Pg$, process is executed in a reverse way to the case $\Delta P_{LD} > \Delta Pg$ (in the above description, addition is exchanged with subtraction and the sign of inequality is reversed). That is, in step S37, a value (m+Δm) obtained by adding a predetermined difference (referred to as Δm) to the present value m of the amplitude of the current is adopted as a new m (m=m+Δm). Next, the processing proceeds to step S43, where $\Delta P_{LD}$ is measured again and the processing proceeds to step S44. In step S44, the measured value of $\Delta P_{LD}$ is compared with ΔPg. When $\Delta P_{LD} > \Delta Pg$, the processing proceeds to step S46. When $\Delta P_{LD} < \Delta Pg$, the processing proceeds to step S45, where the value $\Delta P_{LD}$ is stored in a variable $\Delta P_{LD}0$, and then the processing returns to step S37.

In step S46, judgment is made as to which one of $\Delta P_{LD}0$ and $\Delta P_{LD}$ is closer to ΔPg. That is, when $\Delta P_{LD}0 - \Delta Pg < \Delta Pg - \Delta P_{LD}$ (or $|\Delta P_{LD}0 - \Delta Pg| > |\Delta Pg - \Delta P_{LD}|$, $\Delta P_{LD}$ is closer to ΔPg, so that the processing proceeds to step S36, where the present value of m is adopted for the amplitude of the radio frequency current. When $\Delta P_{LD}0$ is closer to ΔPg, the processing proceeds to step S47, where a value (m−Δm) obtained by subtracting Δm from the present value of m is set for the amplitude value of the radio frequency current. This is because the value of m corresponding to $\Delta P_{LD}0$ is obtained by restoring the value before adding Δm in step S37.

The value of m set in step S36, S42, and S47 is sent to the radio frequency current generation circuit 24 from the control circuit 22A as amplitude command value. Further, in FIG. 7, the switch circuits 29 and 30 are rendered in the second conditions, so that the APC control command value from the control circuit 22A and the laser output monitor value from the photodetector 19 are supplied to the APC circuit 20A to control the emission power at a constant level.

As mentioned above, according to this example, under the condition that the drive current is controlled at a constant level, the control circuit 22A obtains the difference ($\Delta P_{LD}$) in the emission power between when the radio frequency current is superimposed and not superimposed and controls the amplitude of the radio wave frequency current to control the difference at a substantially constant level (target difference in current ΔPg).

Measurement of $\Delta P_{LD}$ shown in FIG. 9 is similar to that of $\Delta I_{LD}$ shown in FIG. 6. The differences between those in FIGS. 6 and 9 are as follows. First, the laser emission power on non-superimposing $P_{LDOFF}[J]$ (refer to step S53) and the laser emission power on superimposing $P_{LDON}[J]$ (refer to step S55) are measured. Second, an average value of difference between $P_{LDON}[J]$ and $P_{LDOFF}[J]$ is obtained, and an emission power difference $\Delta P_{LD}$ is calculated (refer to step S57).

In other words, in this example, the measurement process in FIG. 9 is obtained by changing the current I in FIG. 6 with emission power P. That is, in step S51 in FIG. 9, an integer variable J is initialized (J=0), and then, in the following step S52, the control circuit 22A changes the circuit condition to non-superimposing (amplitude is zero) by sending an command. In the following step S53, a laser output monitor value is obtained from the photodetector 19 and is stored in an array variable $P_{LDOFF}[J]$.

Next in step S54, the control circuit 22A changes the circuit condition to superimposing by sending an command. In the following step S55, a laser output monitor value is obtained from the photodetector 19 and is stored in array variable $P_{LDON}[J]$.

In step S56, the value of J is compared with the upper limit value $J_{max}$. When $J \geq J_{max}$, the processing proceeds step S57. When the number of times does not reach the predetermined times, the processing proceeds to step S58, where one is added to the value of J (incremented), and then the processing returns to step S52.

In step S57, the value of $\Delta P_{LD}$ (average value) is calculated. That is, the value of $\Delta P_{LD}$ is obtained from $\Delta P_{LD} = (\Sigma I_{LDON}[J] - \Sigma I_{LDOFF}[J])/J_{max}$. In this example, after measurement of the emission power on non-superimposing, the emission power on superimposing is measured. However, this order can be reversed.

In the above-mentioned description, temperature conditions of the laser 5 is neglected. It is preferable that the height of pulse peaks of laser emission is controlled in accordance with the temperature of or regarding the laser 5.

Figure 10:
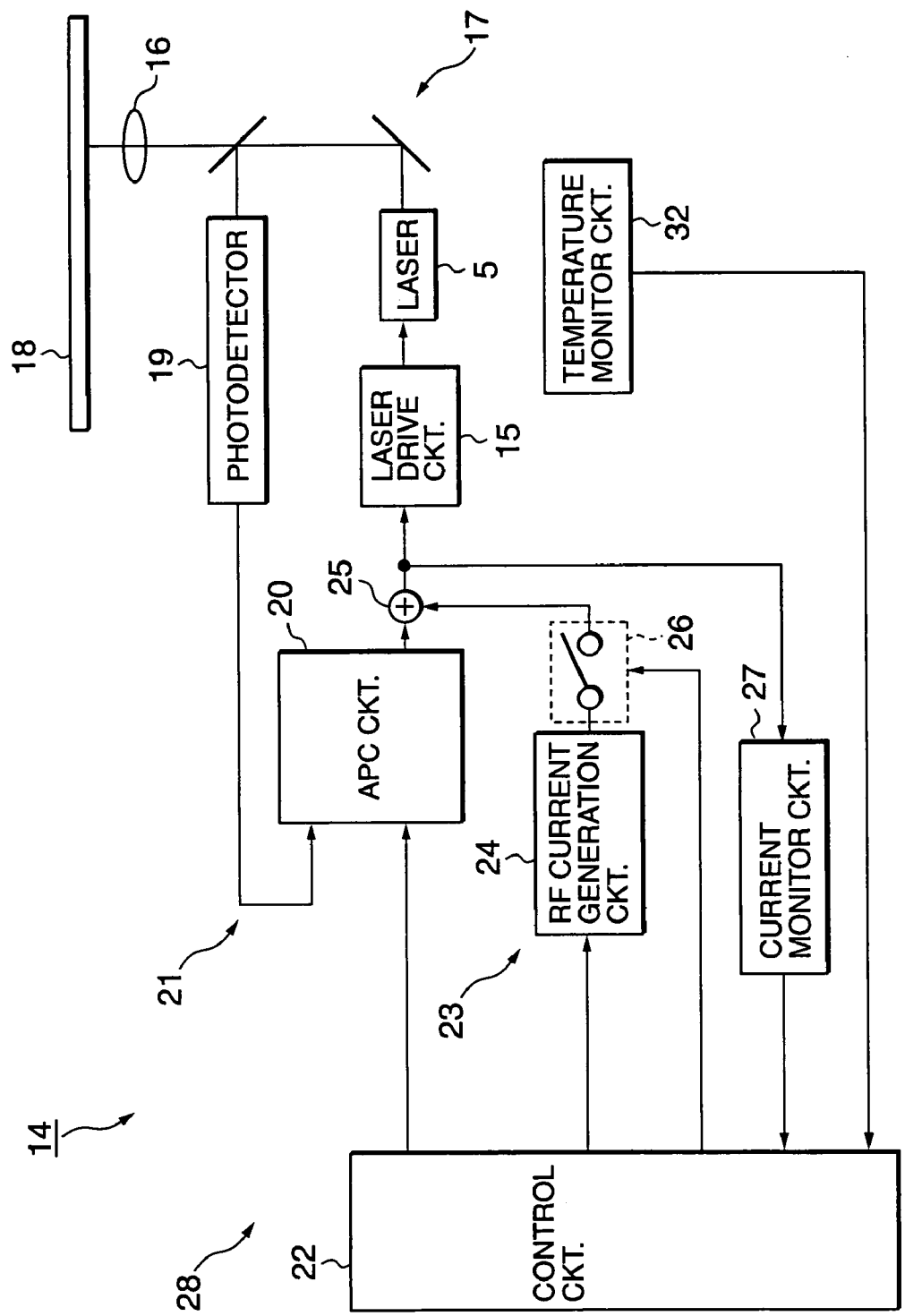
FIG. 10 is a block diagram illustrating an example of a laser drive apparatus according to the present invention in which a temperature monitor circuit is further provided.

For example, as shown in FIG. 10, a temperature monitor circuit 32 is provided for monitoring a temperature regarding the laser 5. The amplitude of the radio frequency current is preferably controlled with the temperature monitor circuit 32 when a temperature change of the laser satisfies a predetermined condition (a temperature variation exceeding a threshold value).

In the structure in FIG. 10 is basically similar to that shown in FIG. 4. The difference between FIGS. 4 and 10 is in that a temperature sensor is further provided. Thus, other portions are designated with the same references as used in FIG. 4.

The temperature monitor circuit 32 is arranged adjacent to the laser 5, which supplies detection information (temperature monitor value) to the control circuit 22 to monitor the temperature regarding the laser 5. The temperature monitor circuit 32 corresponds to the temperature monitor circuit 10 in FIG. 1.

Figure 11:
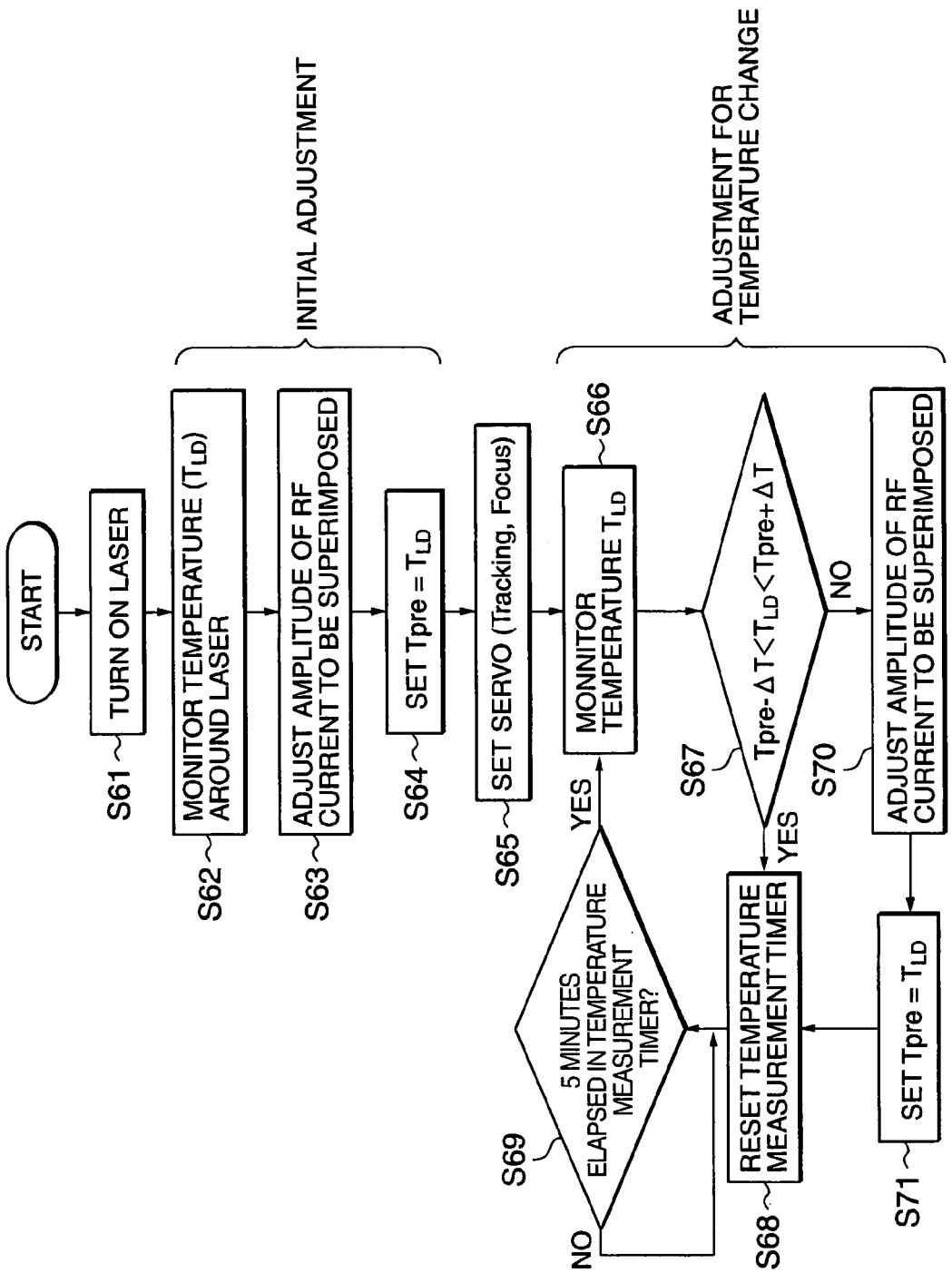
FIG. 11 depicts a flow chart illustrating a setting process of the radio frequency current amplitude value in consideration of temperature variation.

FIG. 11 depicts a flow chart illustrating amplitude adjustment of the radio frequency current in consideration of the temperature change in the laser 5. First, in step S61, the laser 5 is turned on. In the following step S62, a temperature is monitored. More specifically, the temperature monitor circuit 32 detects a temperature around the laser 5 (referred to as $T_{LD}$).

In the following step S63, the amplitude of the radio frequency current is adjusted (set). For example, the amplitude value is determined in accordance with the first method (I). In the next step S64, a variable Rpre is prepared to store a temperature value of $T_{LD}$ at a past time (Tpre=$T_{LD}$). Here, the above-described process corresponds to an initial adjustment.

Next, in step S65, servo control (tracking servo or focus servo) is set. In the following step S66, the temperature $T_{LD}$ is monitored. In the next step S67, it is determined whether $T_{LD}$ satisfies a predetermined condition. For example, a value of difference ΔT representing a temperature variation is previously set and it is determined whether the value of $T_{LD}$ is within a range of (Tpre±ΔT). When Tpre−ΔT<$T_{LD}$<Tpre+ ΔT, the processing proceeds to step S68. If not, the processing proceeds to step S70.

In step S68, a temperature measuring timer is reset and then started. In the following step S69, it is determined whether a predetermined interval (for example, 5 minutes) has elapsed in the temperature measurement timer. If the predetermined interval has elapsed, the processing returns to step S66. If the predetermined interval has not elapsed, the processing continues monitoring the timer. In step S70, the amplitude adjustment of the radio frequency current is determined through the method (I). In the following step S71, the value of $T_{LD}$ obtained in step S66 is stored in Tpre, and the processing proceeds to step S68.

As mentioned above, when the temperature variation of the laser due to a circumference temperature or the like deviates from the allowable range, it is preferable to do the adjustment or setting of the amplitude of the radio frequency current. This may be executed periodically or at an irregular interval or may be always executed.

This example was described with the structure of FIG. 10. However, the method of determining amplitude of the radio frequency current in accordance with the temperature regarding the laser is applicable to other cases. For example, this method is applicable to the example shown in FIG. 7. That is, the temperature monitor circuit 32 is further provided to the structure of FIG. 7, wherein the temperature monitor value is supplied to the control circuit 22A. In this case, the amplitude of the radio frequency current is determined in steps S63 and S70 in accordance with the second method (II).

The laser drive apparatus 14 or 14A is used in an optical head apparatus. In this case, when an information signal is read out from a rewritable recording medium, a care should be paid to prevent the recorded information from being erroneously erased. That is, it is preferable to restrict the optical output of the laser 5 equal to or less than a reproduction power necessary for reading the information signal on the recording medium to prevent an excessive emission power value of the laser due to factors such as temperature variation. For example, it is preferable that the amplitude of the radio frequency current is controlled under condition that the laser is driven with an emission power lower than the reproduction power (there is also a lower limit to prevent excessive low emission power value).

As described above, the laser emission power value is controlled such that in the method (I), the value of Pc is not greater than the reproduction power. In the second method (II), the value of Ic should be suitably set to prevent an excessively large emission power value.

Next, a preferable condition for controlling the amplitude of the radio frequency current will be described. In an application to optical disks, it is preferable to control the amplitude of the radio frequency current when reading or recording is not done for a disk and there is servo control for the lens system.

Generally, in the system using optical disk, there is a condition that focus servo for the object lens or tracking servo is operated but reproduction or recording of the information signal is not done (hereinafter this condition is referred to as idle condition).

Figure 12:
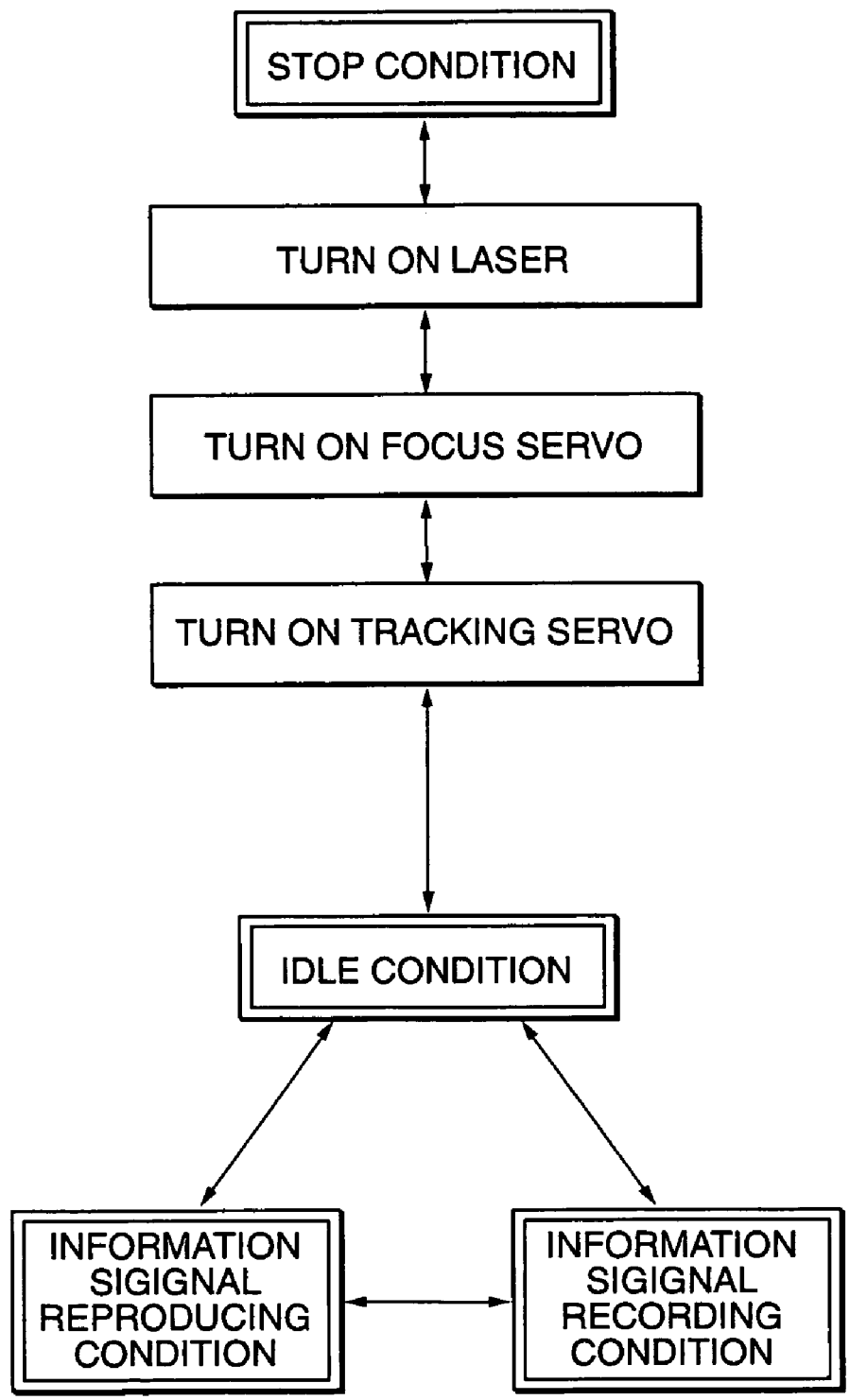
FIG. 12 is an illustration showing an example of transition in operation condition of the optical disc according to the present invention.
Figures 13A, 13B:
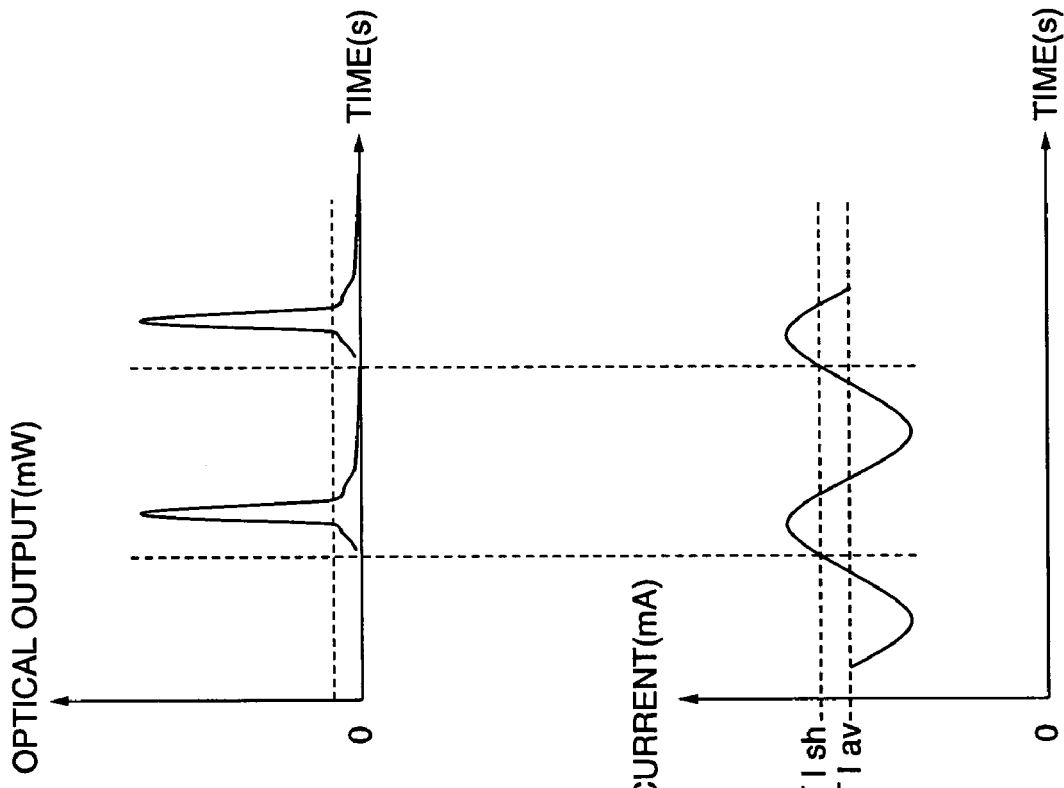
FIGS. 13A and 13B are graphical drawings showing variation in an optical emission power of laser and a drive current according to related art.

FIG. 12 is a drawing illustrating condition transition among respective conditions of the optical disk system. That is, the system has conditions as follows: a stop condition; laser on; focus servo on; tracking servo on; idle condition; information signal reproduction condition; and information recording condition.

Here, "laser on" means that the laser 5 is operating, "focus servo on" means that focus servo control is turned on, and "tracking servo on" means that the tracking servo control is turned on. For example, when the system is started up, the condition transients to "laser on" from the stop condition, and then the condition shifts to "idle condition" via "focus servo on", "tracking servo on". Next, from "idle condition", the system shifts to "information signal reproduction condition" or "information recording condition" and further shifts between "information signal reproduction condition" and "information recording condition".

In optical disc systems such as DVD (Digital Versatile Disk) video, each standard defines format and a data rate (transmission rate) in reading an information signal by an optical disc apparatus. When the tracking servo or focus servo goes beyond its control range, it takes a long interval to restore the operation condition to the information signal reproduction condition or the information signal recording condition, so that it is difficult to keep the specified data rate.

The idle condition occurs frequently in the operation condition of the optical disc apparatus, and an interval necessary for transition from this idle condition to the information signal reproduction condition or the information signal recording condition is relatively short.

Thus, if the amplitude adjustment of the radio frequency current is performed in the idle condition, the amplitude adjustment can be frequently conducted during operation of the optical disk apparatus. For example, if the amplitude is adjusted in accordance with the change in the laser characteristic with temperature variation, the reliability in information signal reproduction can be improved.

Here, though the system is in the idle condition, there is a possible adverse influence on servo control if superimposing of the radio frequency current is stopped for a long period (refer to step S22 and S23 in FIG. 6 and steps S52 and 53). Thus, it is desirable to determine a sufficiently short interval for the allowable non-superimposing interval in consideration of the bandwidth of the servo. For example, if it is assumed that the cutoff frequency regarding the characteristic of the servo is 3 kHz (period: 333 μs), the non-superimposing interval is set to about 20 μs.

Further, in the idle condition, both focus servo and racking servo are operated. However, regarding this, there are modifications. For example, when the focus servo is operated but the tracking servo goes beyond the control range, the amplitude of the radio frequency current can be adjusted. This provides a similar operation.

As mentioned above, the amplitude adjustment of the radio frequency current is preferably performed when the information signal for a recording medium is not read or recorded and the servo control for driving the lens system is carried out, with a result that responsibilities against various type of changes regarding characteristics of the laser is provided without degrading reproduction characteristics.

What is claimed is:

1. A laser driving apparatus including; a laser driving circuit for supplying a drive current to a laser, and radio frequency current superimposing means for generating a radio frequency current and superimposing said radio frequency current on said drive current comprising:

current monitoring means for monitoring said drive current;

optical detection means for detecting an optical output of said laser;

amplitude control means for controlling an amplitude of said radio frequency current to be superimposed on said drive current said amplitude control means controls whether said radio frequency current is superimposed on said driving current or not;

optical output control means for controlling said laser driving circuit to maintain said optical output of said laser at a constant level; and control means for controlling said amplitude of said radio frequency current on the basis of values of said drive current obtained by said current monitoring means at a plurality of said amplitudes of said radio frequency current obtained by said amplitude control means or detection values of said optical output of said laser obtained by said optical detection means at said plurality of said amplitudes of said radio frequency current obtained by said amplitude control means, said control means obtains a difference between said driving current monitored when said radio frequency current is superimposed on said driving current and said driving current monitored when said radio frequency current is not superimposed on said driving current, and controls said amplitude of said radio frequency current on the basis of said difference under the condition that said optical output of said laser is maintained at said constant level.

2. The laser driving apparatus as claimed in claim 1, wherein, the plurality of said amplitudes of said radio frequency current are defined as two values including zero and non-zero.

3. The laser driving apparatus as claimed in claim 1, wherein said control means controls said amplitude of said radio frequency current to maintain a constant difference between said driving current monitored when said radio frequency current is superimposed on said driving current and said driving current monitored when said radio frequency current is not superimposed on said driving current.

4. The laser driving apparatus as claimed in claim 1, wherein said amplitude control means controls whether said radio frequency current is superimposed on said driving current or not, and said control means obtains a difference between said optical output detected when said radio frequency current is superimposed on said driving current and said optical output detected when said radio frequency current is not superimposed on said driving current, and controls said amplitude of said radio frequency current on the basis of said difference under the condition that said driving current is maintained at said constant level.

5. The laser driving apparatus as claimed in claim 4, wherein:

said control means controls said amplitude of said radio frequency current to maintain said difference between said optical output detected when said radio frequency current is superimposed on said driving current and said optical output detected when said radio frequency current is not superimposed on said driving current constant.

6. The laser driving apparatus as claimed in claim 1, further comprising:

temperature monitoring means for monitoring a temperature related to said laser, wherein, said control means controls said amplitude of radio frequency current when a change in said temperature satisfies a predetermined condition.

7. An optical head apparatus including an optical system, a laser driving circuit for supplying a drive current to a laser for emitting laser light through said optical system, and radio frequency current superimposing means for generating a radio frequency current and superimposing said radio frequency current on said drive current for reading information signal from a recording medium, comprising:

current monitoring means for monitoring said drive current;

optical detection means for detecting an optical output of said laser;

amplitude control means for controlling an amplitude of said radio frequency current to be superimposed on said drive current said amplitude control means controls whether said radio frequency current is superimposed on said driving current or not;

optical output control means for controlling said laser driving circuit to control said optical output of said laser at a constant level; and control means for controlling said amplitude of said radio frequency current on the basis of values of said drive current obtained by said current monitoring means at a plurality of said amplitudes of said radio frequency current obtained by said amplitude control means or detection values of said optical output of said laser obtained by said optical detection means at said plurality of said amplitudes of said radio frequency current obtained by said amplitude control means, said control means obtains a difference between said driving current monitored when said radio frequency current is superimposed on said driving current and said driving current monitored when said radio frequency current is not superimposed on said driving current, and controls said amplitude of said radio frequency current on the basis of said difference under the condition that said optical output of said laser is maintained at said constant level.

8. The optical head apparatus as claimed in claim 7, wherein the plurality of said amplitudes of said radio frequency current are defined as two values including zero and non-zero.

9. The optical head apparatus as claimed in claim 7, wherein said control means controls said amplitude of said radio frequency current to maintain a constant difference between said driving current monitored when said radio frequency current is superimposed on said driving current and said driving current monitored when said radio frequency current is not superimposed on said driving current.

10. The optical head apparatus as claimed in claim 7, wherein said amplitude control means whether said radio frequency current is superimposed on said driving current or not, and said control means obtains a difference between said optical output detected when said radio frequency current is superimposed on said driving current and said optical output detected when said radio frequency current is not superimposed on said driving current, and controls said amplitude of said radio frequency current on the basis of said difference under the condition that said optical output of said laser is maintained at said constant level.

11. The optical head apparatus as claimed in claim 10, wherein:

said control means controls said amplitude of said radio frequency current to maintain constant said difference between said optical output detected when said radio frequency current is superimposed on said driving current and said optical output detected when said radio frequency current is not superimposed on said driving current.

12. The optical head apparatus as claimed in claim 7, further comprising:

temperature monitoring means for monitoring a temperature related to said laser, wherein, said control means controls said amplitude of radio frequency current when a change in said temperature satisfies a predetermined condition.

13. The optical head apparatus as claimed in claim 7, wherein said amplitude of said radio frequency current is controlled under control that said optical output control means controls said laser driving circuit to make said optical output of said laser at said constant level which is not greater than a reproduction power necessary for reading said information signal.

14. An information processing apparatus including a laser driving circuit for supplying a drive current to a laser, a radio frequency current superimposing means for generating a radio frequency current and superimposing said radio frequency current on said drive current, a lens system for reading and recording information signal for a recording medium; and servo control means for controlling said lens system; comprising:

current monitoring means for monitoring said drive current;

optical detection means for detecting an optical output of said laser;

amplitude control means for controlling an amplitude of said radio frequency current to be superimposed on said drive current said amplitude control means controls whether said radio frequency current is superimposed on said driving current or not;

optical output control means for controlling said laser driving circuit to maintain said optical output of said laser at a constant level; and control means for controlling said amplitude of said radio frequency current on the basis of values of said drive current obtained by said current monitoring means at a plurality of said amplitudes of said radio frequency current obtained by said amplitude control means or detection values of said optical output of said laser obtained by said optical detection means at said plurality of said amplitudes of said radio frequency current obtained by said amplitude control means, said control means obtains a difference between said driving current monitored when said radio frequency current is superimposed on said driving current and said driving current monitored when said radio frequency current is not superimposed on said driving current, and controls said amplitude of said radio frequency current on the basis of said difference under the condition that said optical output of said laser is maintained at said constant level.

15. The information processing apparatus as claimed in claim 14, wherein the plurality of said amplitudes of said radio frequency current are defined as two values including zero and non-zero.

16. The information processing apparatus as claimed in claim 14, wherein said control means controls said amplitude of said radio frequency current to maintain a constant difference between said driving current monitored when said radio frequency current is superimposed on said driving current and said driving current monitored when said radio frequency current is not superimposed on said driving current.

17. The information processing apparatus as claimed in claim 14, wherein said amplitude control means controls whether said radio frequency current is superimposed on said driving current or not, and said control means obtains a difference between said optical output detected when said radio frequency current is superimposed on said driving current and said optical output detected when said radio frequency current is not superimposed on said driving current, and controls said amplitude of said radio frequency current on the basis of said difference under the condition that said drive current of said laser is maintained at a constant level.

18. The information processing apparatus as claimed in claim 17, wherein:

said control means controls said amplitude of said radio frequency current to maintain constant said difference between said optical output detected when said radio frequency current is superimposed on said driving current and said optical output detected when said radio frequency current is not superimposed on said driving current.

19. The information processing apparatus as claimed in claim 14, further comprising:

temperature monitoring means for monitoring a temperature related to said laser, wherein, said control means controls said amplitude of radio frequency current when a change in said temperature satisfies a predetermined condition.

20. The information processing apparatus as claimed in claim 14, wherein said amplitude of said radio frequency current is controlled, while said optical output control means controls said laser driving circuit to make said optical output of said laser at said constant level which is not greater than a reproduction power necessary for reading said information signal.

21. The information processing apparatus as claimed in claim 14, wherein said amplitude control means and said control means control said amplitude of said radio frequency current when said reading and recording said information signal is not executed.

* * * * *